United States Patent [19]

Nathan et al.

[11] Patent Number: 5,726,482
[45] Date of Patent: Mar. 10, 1998

[54] DEVICE-UNDER-TEST CARD FOR A BURN-IN BOARD

[75] Inventors: Richard J. Nathan, Morgan Hill; James J. D. Lan, Fremont; Steve S. Chiang, Saratoga; Paul Y. F. Wu, San Jose; Robert Osann, Jr., Los Altos, all of Calif.

[73] Assignee: Prolinx Labs Corporation, San Jose, Calif.

[21] Appl. No.: 319,906

[22] Filed: Oct. 7, 1994

Related U.S. Application Data

[63] Continuation-in-part of Ser. No. 194,110, Feb. 8, 1994, abandoned.

[51] Int. Cl.$^6$ .................................................. H01L 29/00
[52] U.S. Cl. ............................................................ 257/529
[58] Field of Search ........................... 257/529; 437/211

[56] References Cited

U.S. PATENT DOCUMENTS

| | | | |
|---|---|---|---|
| 3,335,327 | 8/1967 | Damon et al. | 317/101 |
| 3,384,879 | 5/1968 | Stahl et al. | |
| 3,808,576 | 4/1974 | Castonguay et al. | 338/309 |
| 3,857,683 | 12/1974 | Castonguay | 29/195 |
| 3,923,359 | 12/1975 | Newsam | 339/17 |
| 4,090,667 | 5/1978 | Crimmins | 339/19 |
| 4,146,863 | 3/1979 | Mollenhoff | 337/296 |
| 4,238,839 | 12/1980 | Redfern et al. | 365/96 |
| 4,245,273 | 1/1981 | Feinberg et al. | 361/382 |
| 4,399,372 | 8/1983 | Tanimoto et al. | 307/279 |
| 4,413,272 | 11/1983 | Mochizuki et al. | 357/65 |
| 4,420,820 | 12/1983 | Preedy | 365/105 |
| 4,433,331 | 2/1984 | Kollaritsch | 340/825.83 |
| 4,455,495 | 6/1984 | Masuhara et al. | 307/44 |
| 4,458,297 | 7/1984 | Stopper et al. | 361/403 |
| 4,491,860 | 1/1985 | Lim | 357/68 |
| 4,507,756 | 3/1985 | McElroy | 365/104 |
| 4,507,757 | 3/1985 | McElroy | 365/104 |

(List continued on next page.)

FOREIGN PATENT DOCUMENTS

| | | | |
|---|---|---|---|
| 0336359 | 10/1989 | European Pat. Off. | |
| 59-13368 | 1/1984 | Japan | 257/529 |

OTHER PUBLICATIONS

Letter to Hugo Goris from J. Rapaille, Philips Components, Jul. 6, 1994, 2 pages.

"I/O Buffering System to a Programmable Switching Apparatus", Wen–Jai Hsieh, Official Gazette, Jan. 25, 1994, 1 page.

"CMOS Resistive Fuses for Image Smoothing and Segmentation", Paul C. Yu, etc., IEEE Journal of Solid–State Circuits, vol. 27, No. 4, Apr. 1992, pp. 545–553.

"A New Circuit Substrate For MCM–L", Yusuke Wada, etc., ICEMCM '95, pp. 59–64. No month.

"Matsushita Team Eliminates Holes in High–Density PCB", Kenji Tsuda, Nikkei electronics Asia, Mar. 1995, pp. 69–70.

(List continued on next page.)

*Primary Examiner*—Tom Thomas
*Attorney, Agent, or Firm*—Skjerven, Morrill, MacPherson, Franklin & Friel; Alan H. MacPherson; Omkar K. Suryadevara

[57] ABSTRACT

A device-under-test card includes a matrix of fuses and/or antifuses formed as part of a multi-layered structure. The matrix of fuses and/or antifuses can be electrically programmed to connect any one of first electrical contacts to any one of second electrical contacts and so allows the device-under-test card to act as a junction between burn-in board traces couplable to signal drivers and/or receivers and burn-in board traces couplable to terminals of a device-under-test. The device-under-test card also includes a discrete resistor or alternatively a resistor ladder that permits a terminal of a device-under-test to be coupled to a power or ground terminal or to any combination of resistances including a short, in addition or as an alternative to any one of various signal drivers and/or receivers.

2 Claims, 5 Drawing Sheets

Microfiche Appendix Included
(14 Microfiche, 184 Pages)

U.S. PATENT DOCUMENTS

| Number | Date | Name | Class |
|---|---|---|---|
| 4,547,830 | 10/1985 | Yamauchi | 257/529 |
| 4,562,639 | 1/1986 | McElroy | 29/584 |
| 4,565,712 | 1/1986 | Noguchi et al. | 427/53.1 |
| 4,566,186 | 1/1986 | Bauer et al. | 29/852 |
| 4,569,120 | 2/1986 | Stacy et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg | 365/100 |
| 4,609,241 | 9/1986 | Peterson | 257/529 |
| 4,642,160 | 2/1987 | Burges | 156/630 |
| 4,651,409 | 3/1987 | Ellsworth et al. | 29/576 |
| 4,652,974 | 3/1987 | Ryan | 361/395 |
| 4,678,889 | 7/1987 | Yamanaka | 219/121 |
| 4,689,441 | 8/1987 | Dick et al. | 174/68.5 |
| 4,700,116 | 10/1987 | Inoue et al. | 318/254 |
| 4,700,214 | 10/1987 | Johnson | 357/68 |
| 4,710,592 | 12/1987 | Kimbara | 174/68.5 |
| 4,721,868 | 1/1988 | Cornell et al. | 307/465 |
| 4,726,991 | 2/1988 | Hyatt et al. | 428/329 |
| 4,731,704 | 3/1988 | Lochner | |
| 4,748,490 | 5/1988 | Hollingsworth | 357/51 |
| 4,757,359 | 7/1988 | Chiao et al. | 357/23.5 |
| 4,780,670 | 10/1988 | Cherry | 324/158 P |
| 4,786,904 | 11/1988 | Graham, III et al. | 340/825 |
| 4,789,760 | 12/1988 | Koyama et al. | 174/68.5 |
| 4,791,075 | 12/1988 | Lin | 437/209 |
| 4,792,835 | 12/1988 | Sacarisen et al. | 357/23.6 |
| 4,796,074 | 1/1989 | Roesner | 357/51 |
| 4,796,075 | 1/1989 | Whitten | 357/51 |
| 4,799,128 | 1/1989 | Chen | 361/414 |
| 4,803,595 | 2/1989 | Kraus et al. | 361/412 |
| 4,808,967 | 2/1989 | Rice et al. | 338/309 |
| 4,821,142 | 4/1989 | Ushifusa et al. | 361/395 |
| 4,823,181 | 4/1989 | Mohsen et al. | 357/51 |
| 4,829,404 | 5/1989 | Jensen | 361/398 |
| 4,839,864 | 6/1989 | Fujishima | 365/200 |
| 4,840,924 | 6/1989 | Kinbara | |
| 4,841,099 | 6/1989 | Epstein et al. | 174/68.5 |
| 4,845,315 | 7/1989 | Stopper | 361/428 |
| 4,847,732 | 7/1989 | Stopper et al. | 361/395 |
| 4,864,165 | 9/1989 | Hoberman et al. | 307/467 |
| 4,873,506 | 10/1989 | Gurevich | 257/529 |
| 4,874,711 | 10/1989 | Hughes et al. | 437/8 |
| 4,876,220 | 10/1989 | Mohsen et al. | 437/170 |
| 4,881,114 | 11/1989 | Mohsen et al. | 357/54 |
| 4,882,611 | 11/1989 | Blech et al. | 357/51 |
| 4,888,574 | 12/1989 | Rice et al. | 338/309 |
| 4,888,665 | 12/1989 | Smith | 361/400 |
| 4,892,776 | 1/1990 | Rice | 428/209 |
| 4,893,167 | 1/1990 | Boudou et al. | 357/51 |
| 4,897,836 | 1/1990 | Fitzpatrick et al. | 370/112 |
| 4,899,205 | 2/1990 | Hamdy et al. | 357/51 |
| 4,910,418 | 3/1990 | Graham et al. | 307/465 |
| 4,914,055 | 4/1990 | Gordon et al. | 437/192 |
| 4,915,983 | 4/1990 | Lake et al. | 427/98 |
| 4,916,809 | 4/1990 | Boudou et al. | 29/852 |
| 4,920,454 | 4/1990 | Stopper et al. | 361/398 |
| 4,924,287 | 5/1990 | Orbach | 357/51 |
| 4,933,738 | 6/1990 | Orbach et al. | 357/51 |
| 4,935,584 | 6/1990 | Boggs | 174/262 |
| 4,937,475 | 6/1990 | Rhodes et al. | 307/465 |
| 4,943,538 | 7/1990 | Mohsen et al. | 437/52 |
| 4,949,084 | 8/1990 | Schwartz et al. | 257/530 |
| 4,969,124 | 11/1990 | Luich et al. | 365/201 |
| 4,974,048 | 11/1990 | Chakravorty et al. | 357/40 |
| 4,977,357 | 12/1990 | Shrier | 338/21 |
| 4,992,333 | 2/1991 | Hyatt | 428/402 |
| 5,003,486 | 3/1991 | Hendel et al. | 364/483 |
| 5,014,002 | 5/1991 | Wiscombe et al. | 324/158 F |
| 5,027,191 | 6/1991 | Bourdelaise et al. | 357/74 |
| 5,030,113 | 7/1991 | Wilson | 439/80 |
| 5,055,321 | 10/1991 | Enomoto et al. | 427/98 |
| 5,055,973 | 10/1991 | Mohsen | 361/414 |
| 5,060,116 | 10/1991 | Grobman et al. | 361/474 |
| 5,068,634 | 11/1991 | Shrier | 338/21 |
| 5,077,451 | 12/1991 | Mohsen | 174/261 |
| 5,092,032 | 3/1992 | Murakami | 29/830 |
| 5,097,593 | 3/1992 | Jones et al. | 29/852 |
| 5,099,149 | 3/1992 | Smith | 307/465 |
| 5,099,380 | 3/1992 | Childers et al. | 361/56 |
| 5,106,773 | 4/1992 | Chen et al. | 437/51 |
| 5,120,679 | 6/1992 | Boardman et al. | 437/195 |
| 5,142,263 | 8/1992 | Childers et al. | 338/21 |
| 5,144,567 | 9/1992 | Oelsch et al. | 364/708 |
| 5,148,265 | 9/1992 | Khandros et al. | 357/80 |
| 5,155,577 | 10/1992 | Chance et al. | 357/71 |
| 5,166,556 | 11/1992 | Hsu et al. | 307/465 |
| 5,181,859 | 1/1993 | Foreman et al. | 439/225 |
| 5,189,387 | 2/1993 | Childers et al. | 338/20 |
| 5,196,724 | 3/1993 | Gordon et al. | 257/530 |
| 5,200,652 | 4/1993 | Lee | 307/465 |
| 5,218,679 | 6/1993 | Hasegawa et al. | 395/275 |
| 5,220,490 | 6/1993 | Weigler et al. | 361/409 |
| 5,233,217 | 8/1993 | Dixit et al. | 257/530 |
| 5,248,517 | 9/1993 | Shrier et al. | 427/58 |
| 5,250,228 | 10/1993 | Baigrie et al. | 252/511 |
| 5,250,470 | 10/1993 | Yamaguchi | 437/211 |
| 5,258,643 | 11/1993 | Cohen | 257/530 |
| 5,260,848 | 11/1993 | Childers | 361/127 |
| 5,262,754 | 11/1993 | Collins | 338/21 |
| 5,264,729 | 11/1993 | Rostoker et al. | 257/774 |
| 5,282,271 | 1/1994 | Hsieh et al. | 395/275 |
| 5,282,312 | 2/1994 | DiStefano et al. | 29/830 |
| 5,300,208 | 4/1994 | Angelopoulos et al. | 205/50 |
| 5,311,053 | 5/1994 | Law et al. | 257/529 |
| 5,317,801 | 6/1994 | Tanaka et al. | 29/830 |
| 5,319,238 | 6/1994 | Gordon et al. | 257/530 |
| 5,321,322 | 6/1994 | Verheyen et al. | 307/465.1 |
| 5,329,153 | 7/1994 | Dixit | 257/530 |
| 5,347,258 | 9/1994 | Howard et al. | 338/333 |
| 5,349,248 | 9/1994 | Parlour et al. | 307/465 |
| 5,362,676 | 11/1994 | Gordon et al. | 437/192 |
| 5,367,764 | 11/1994 | DiStefano et al. | 29/830 |
| 5,377,124 | 12/1994 | Mohsen | 364/489 |
| 5,397,921 | 3/1995 | Karnezos | 257/779 |
| 5,409,865 | 4/1995 | Karnezos | 437/210 |
| 5,410,806 | 5/1995 | Schneider | 29/840 |
| 5,420,456 | 5/1995 | Galbi et al. | 257/529 |
| 5,420,460 | 5/1995 | Massingill | 257/693 |
| 5,438,166 | 8/1995 | Carey et al. | 174/261 |

OTHER PUBLICATIONS

"Printed Circuit Board Design Guidelines for Ball Grid Array Packages", Patrick Johnston, Motorola, Inc., pp. 255–260. No date.

"An Enhanced Performance Low Cost BGA Package", Robert Marrs, etc. Amkor Electronics, Inc., Chandler, AZ, pp. 214–225. No date.

Morrison, J.M., et al., "A Large Format Modified Tea $Co_2$ Laser Based Process for Cost Effective Small Via Generation", MCM '94 Proceedings, pp. 369–377, (1994). No month.

Redmond, T.F., et al., "The Application of Laser Process Technology to Thin Film Packaging", IEEE, pp. 1066–1071, (1992). No month.

Stopperan, J., "Rigid–Flex: The Old and The New", date unknow, (4 pages).

Joshua Silver, "High–Performance Scalable Switch Design," ASIC & EDA, Jun. 1994, pp. 38–48.

Kathryn E. Gordon and Richard J. Wong, "Conducting Filament of the Programmed Metal Electrode Amorphous Silicon Antifuse," IEEE, 1993, pp. 27–30. No month.

Paul C. Yu, Steven J. Decker, Hae–Seung Lee, Charles G. Sodini and John L. Wyatt, "CMOS Resistive Fuses For Image Smoothing and Segmentation," 1992 IEEE, IEEE Journal of Solid–State Circuits, vol. 27, No. 4, Apr. 1992, pp. 545–553.

Chenming Hu, "Interconnect Devices For Field Programmable Gate Array," IEEE, 1992, pp. 591–594. No month.

Steve Chiang, Rahim Forouhi, Wenn Chen, Frank Hawley, John McCollum, Esmat Hamdy and Chenming Hu, "Antifuse Structure Comparison For Field Programmable Gate Arrays," IEEE, 1992, pp. 611–614. No month.

Bernie DiMarco and Steve Hansen, "Interplay Of Energies In Circuit Breaker And Fuse Combinations," 1991 IEEE, pp. 1765–1769. No month.

Fred Ki, Raj Bachireddy, Darryl Jeong, Steve Cheng and Thu Nguyen, "An Ultra High Speed ECL Programmable Logic Device," IEEE 1990 Bipolar Circuits and Technology Meeting 3.1. No month.

Ali Iranmenesh, Steve Jurichich, Vida Ilderem, Rich Jerome, SP Joshi, Madan Biswal, Bami Bastani, "Advanced Single Poly BiCMOS Technology For High Performance Programmable TTL/ECL Application," IEEE, 1990. No month.

Ron Iscoff, "Characterizing Quickturn Asics: It's Done With Mirrors," Semiconductor International, Aug. 1990.

Esmat Hamdy, John McCollum, Shih–ou Chen, Steve Chiang, Shafy Eltoukhy, Jim Chang, Ted Speers, and Amr Mohsen, "Dielectric Based Antifuse For Logic And Memory ICs," IEDM, 1988, pp. 786–789. No month.

James B. Gullette and Douglas M. Green, "Laser Personalization of NMOS Digital Topologies," Texas A&M University, 1993 IEEE, International Syposium on Circuits and Systems, pp. 1249–1252. No month.

Masafumi Tanimoto, Junichi Murota, Yasuo Ohmori, and Nobuaki Ieda, "A Novel MOS PROM Using A Highly Resistive Poly–Si Resistor," 1980 IEEE, pp. 517–520. No month.

R. Ranjan, G. Frind, C.E. Peterson and J.J. Carroll, "An Advancement In the Design and Application Of Current–Limiting Fuses," pp. 36–40. No date.

Hae–Seung Lee and Paul Yu, "CMOS Resistive Fuse Circuits," pp. 109–110. No date.

T. Lipski, "Distribution Fuses Of Nearest Future," pp. 41–45. No date.

ASM Handbook, vol. 3, Alloy Phase Diagrams. No date.

DEVICE-UNDER-TEST CARD FOR A BURN-IN BOARD

CROSS-REFERENCE OF THE RELATED ART

This is a continuation-in-part of U.S. patent application Ser. No. 08/194,110 now abandoned, titled "Programmable/Reprogrammable Printed Circuit Board Using Fuse And/Or Antifuse As Interconnect Structures" by Richard J. Nathan, James J. D. Lan and Steve S. Chiang, filed Feb. 8, 1994.

CROSS-REFERENCE TO MICROFICHE APPENDIX

Microfiche Appendix A (12 sheets with 159 frames) is an illustrative computer program and related data for use with one embodiment of the present invention. Microfiche Appendix B (1 sheet with 17 frames) contains illustrative hardware circuit diagrams for use with one embodiment of the present invention. Microfiche Appendix C (1 sheet with 8 frames) is a table of ratings and part numbers for components in Appendix B.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to the field of programmable interconnect structures for use with burn-in boards and more specifically to a programmable scrambler card and a device-under-test card for a burn-in-board.

BACKGROUND OF THE INVENTION

Burn-in boards are used in certain processes for manufacturing electronic components, such as integrated circuits (ICs), to burn-in, i.e. exercise and stress the electronic components at elevated temperatures. Burn-in accelerates infant mortality so that defective electronic components are discarded based on the results of subsequent testing. So burn-in ensures reliability of an electronic component during normal operation as part of a predetermined circuit.

Most conventional burn-in boards have dedicated wiring to connect signal drivers and/or receivers to devices-under-test. Instead of dedicated wiring, some conventional burn-in boards have a scrambler card to provide a junction between traces on the burn-in board and signal drivers and receivers. The traces are couplable to terminals of an electronic component under test, also referred to as a "device-under-test" (DUT) that is mounted on the burn-in board. Conventional scrambler cards are manually wired. Manual wiring is prone to mistakes and results in high labor cost.

In addition to scrambler cards, device-under-test cards can be used in a burn-in board to route signals, power and ground between traces on the burn-in board and terminals of the device-under-test. Conventional device-under-test cards are also manually wired and also have the same disadvantages as conventional scrambler cards.

SUMMARY OF THE INVENTION

In accordance with this invention, an electrically programmable scrambler card, hereinafter "scrambler card," comprises a matrix of fuses and/or antifuses formed as part of a multi-layered structure. The multi-layered structure is formed by conventional processes used to form, for example, a printed circuit board (PCB), a printed wiring board (PWB), a multi-chip module (MCM) and a package for an integrated circuit (also referred to as an IC package).

The matrix of fuses and/or antifuses of the multi-layered structure can be electrically programmed to interconnect any one of a plurality of first electrical contacts to any one of a plurality of second electrical contacts, wherein each of the first electrical contacts and the second electrical contacts is formed at a signal interface edge of the scrambler card. The signal interface edge can be inserted into a connector on a burn-in board after appropriate programming of the scrambler card, to provide a junction between signal drivers and receivers and traces on the burn-in board in the conventional manner. Electrical programmability of a scrambler card results in lower cost, faster time-to-market and fewer mistakes, as compared to conventional scrambler cards.

A device-under-test card, hereinafter DUT card, contains a matrix similar to the matrix of fuses and/or antifuses in the scrambler card described above, and in addition, includes one or more resistances, several traces and one or more decoupling capacitors.

In one embodiment, the resistances are formed as a resistor ladder, which includes a number of buried resistances in parallel, and which allows any terminal of a device-under-test to be coupled to any combination of resistances by appropriate programming of the matrix of fuses and/or antifuses on the DUT card.

Traces in the DUT card also allow any terminal of a device-under-test to be connected to power and ground, and to drivers and/or receivers of signals, such as a predetermined test signal, or another signal, such as a clock signal, by appropriate programming of the matrix of fuses and/or antifuses. The decoupling capacitors in the DUT card allow the DUT card to provide better power and ground because decoupling of power and ground is performed in the DUT card adjacent to the device-under-test. The DUT card also has the same advantages as those described above for the programmable scrambler card, i.e., low cost, low turn-around time and error free alternative to a conventional customized DUT card.

BRIEF DESCRIPTION OF THE DRAWINGS

FIGS. 1A and 1B illustrate in plan view one embodiment of a programmable scrambler card 111 and a burn-in board 110, respectively.

FIGS. 1A-1 and 1B-1 illustrate, in enlarged views, respective portions labeled 1A-1 in FIG. 1A, and 121A in FIG. 1B.

DETAILED DESCRIPTION

The success of the field programmable logic (memory) technologies for semiconductor devices has demonstrated that time-to-market with today's greatly reduced product life cycle has altered the planning strategy of today's technical companies. In accordance with this invention, we have recognized that it is advantageous to extend such a time-tomarket concept from integrated circuits to printed circuit boards (PCBs). Although PCBs are referenced in the following description, any structure for interconnection of one or more terminals of one or more electronic components can be built in accordance with this invention. Furthermore, any applications that require programmable logic substrates other than semiconductor substrates can be built in accordance with this invention.

The PCB environment limits manufacturing temperature to between 150° C. to 300° C. (except for ceramic packaging). None of the semiconductor fuse materials or ceramic fuse materials can be deposited within these temperatures because processing temperatures for such materials are well in excess of 350° C. or 400° C. Therefore a new class of fuse materials is required for use with PCBs. Moreover, greater efficiency and better time-to-market are achieved if the fuse materials for PCBs are compatible with the PCB processsing.

Figures 1, 1A:
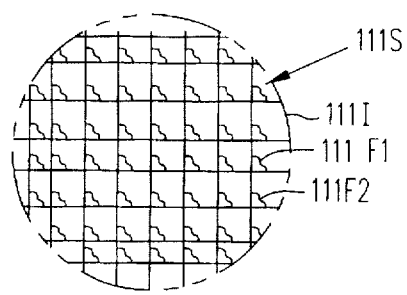
Figure 1A:
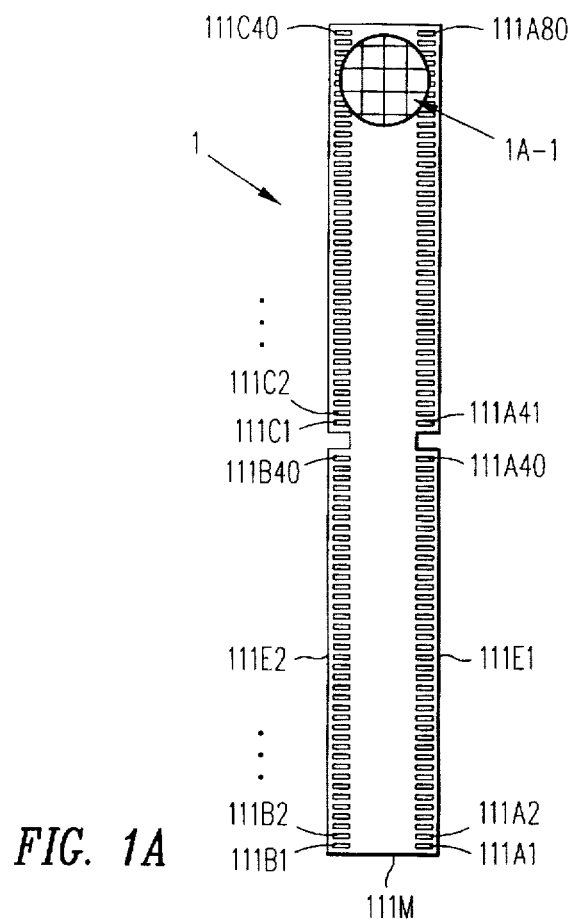

One embodiment of this invention includes an electrically programmable scrambler card 111 (FIG. 1A), hereinafter scrambler card 111, that includes a multi-layered structure 111M having a matrix 111S (insert 111I) of fuses and/or antifuses, such as fuses 111F1 and 111F2. For clarity, not all of the parts in FIG. 1 are labeled.

Matrix 111S of fuses and/or antifuses can be any matrix of the type described in U.S. patent application Ser. No. 08/194,110 filed Feb. 8, 1994 now abandoned or U.S patent application Ser. No. 08/320,145, being filed Oct. 7, 1994 that are both incorporated herein in their entirety.

Figure 1C:
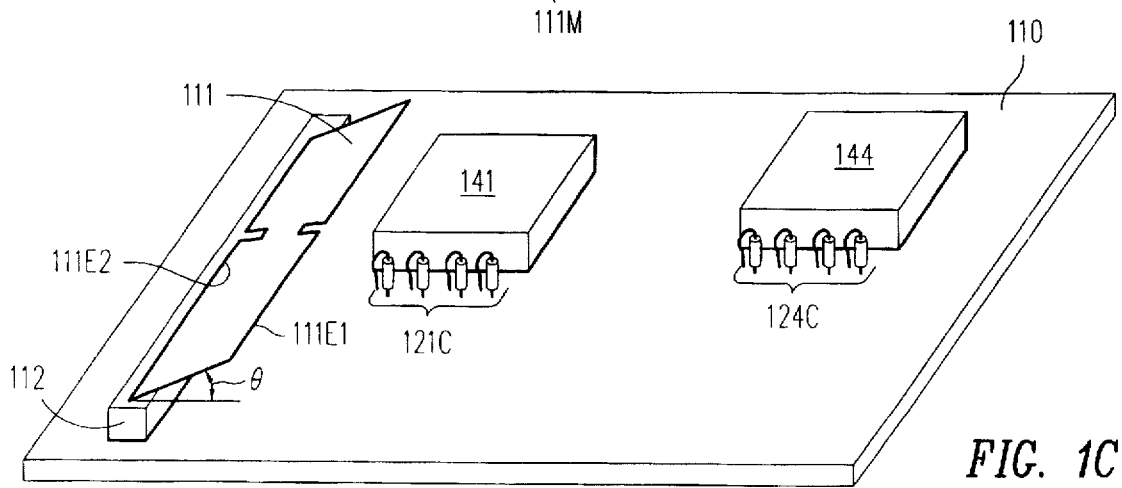
FIG. 1C illustrates a perspective view of scrambler card 111 mounted in burn-in board 110.
Figures 1, 1B:
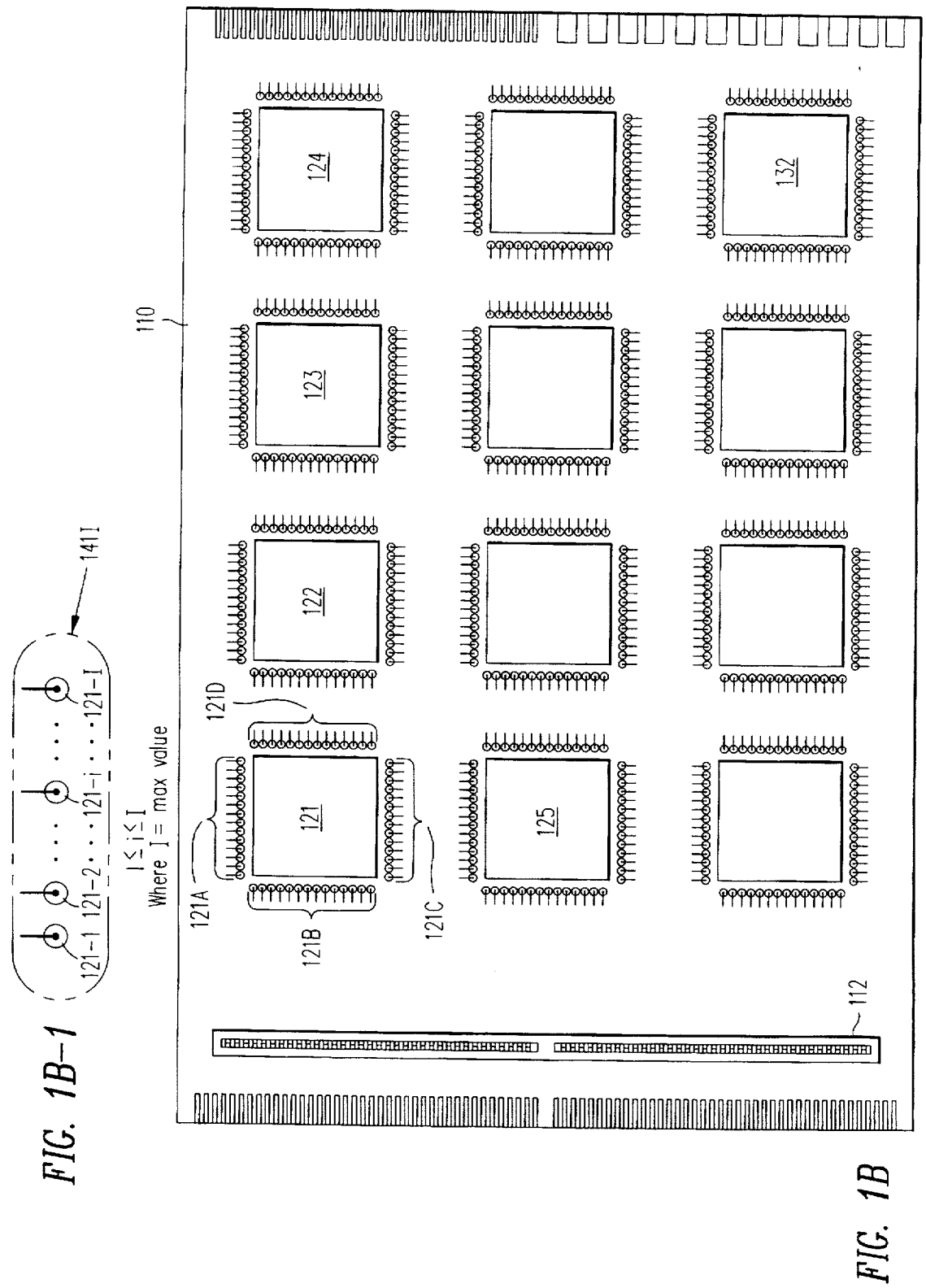
Figure 1D:
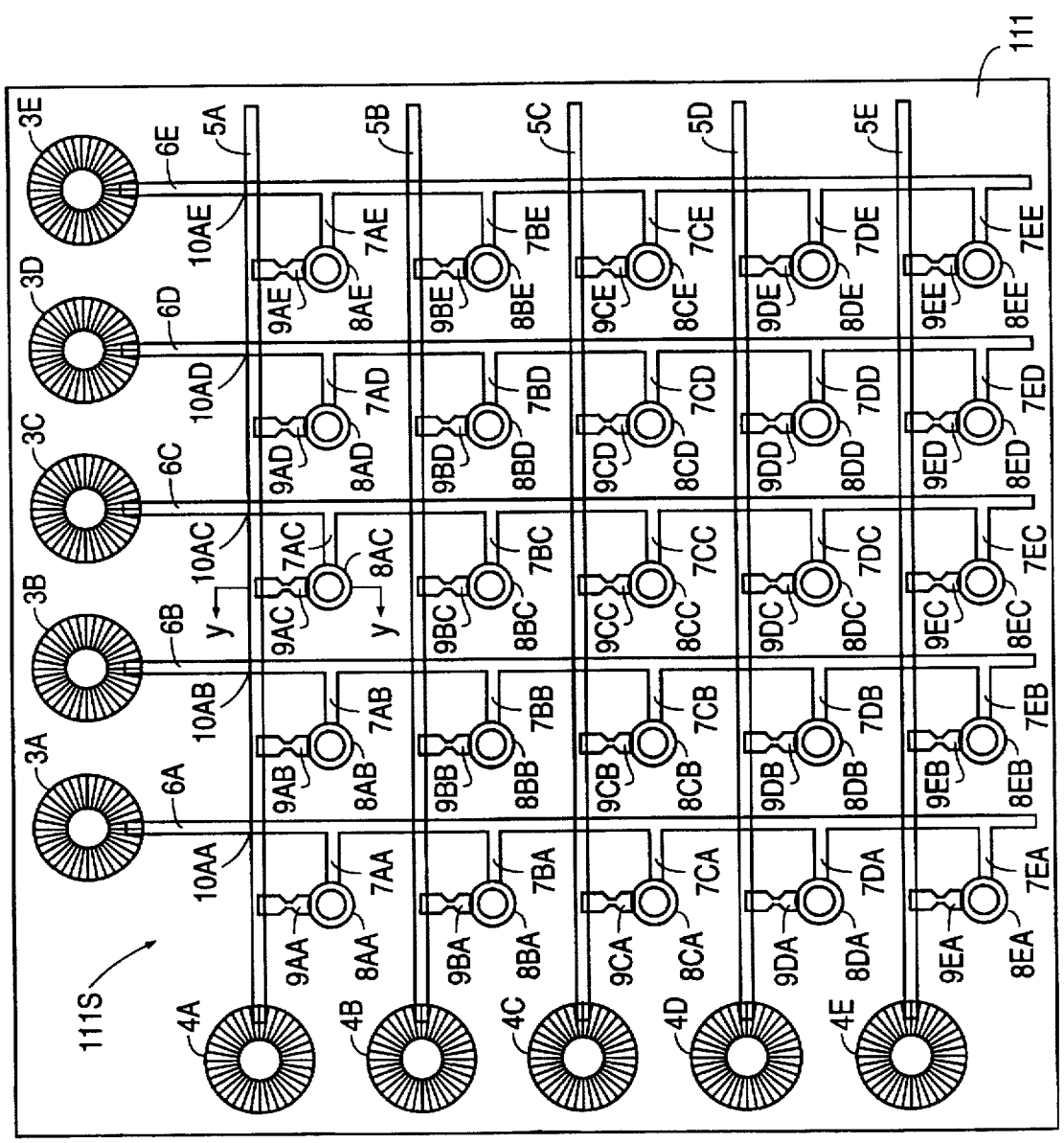
FIG. 1D illustrates the matrix of fuses in FIG. 1A that are manufactured on a printed circuit board in accordance with one embodiment of this invention.

As shown in FIG. 1D, a programmable scrambler card 111 includes a matrix 111S of fuse elements 9AA to 9EE and conductive traces 5A to 5E and 6A to 6E together with via holes 3A–3E and 4A–4E designed to receive the terminals of an electronic component. Via holes 3A–3E are accessible from the upper-most exposed surface of the PCB and are connected to a set of parallel metal traces 6A–6E formed as part of an inner layer of the card 111. Via holes 4A–4E are also accessible from the upper-most exposed surface of card 111 and are connected to another set of parallel metal traces 5A–5E formed as part of a different inner layer of card 111 from the inner layer containing traces 6A–6E. Metal traces 5A–5E are insulated from metal traces 6A–6E at cross-over points, such as for example, 10AA–10AE (not all cross-over points are labeled in FIG. 1D for clarity).

Conductive connectors 7AA–7EE are formed as part of the same PCB layer as metal traces 6A–6E and connect metal traces 6A–6E to linking via holes 8AA–8EE. In the embodiment of FIG. 1D, linking via holes 8AA–8EE are smaller than via holes 3A–3E and 4A–4E and are inaccessible from the upper-most surface of the card 111. Linking via holes 8AA–8EE are plated and are designed to connect conductive connectors 7AA–7EE to fuses 9AA–9EE. Fuses 9AA–9EE are formed in the same layer as, and are connected to, metal traces 5A–5E.

Although in the embodiment shown in FIG. 1D, linking via holes 8AA–8EE are inaccessible from the upper-most surface of the PCB in another embodiment of this invention the linking via holes are accessible from the upper-most surface of the PCB. In another embodiment of this invention the linking via holes are designed to receive the terminals of an electronic component.

In the embodiment shown in FIG. 1D, metal traces 5A–5E and 6A–6E are patterned in two sets of transverse parallel lines to form part of matrix 111S. Therefore an electronic component's terminal in any via hole 3A–3E or 4A–4E is initially connected to terminals in every via hole 3A–3E and 4A–4E through one of fuses 9AA–9EE. For example, one path between via hole 4C and via hole 3E includes a fuse 9CE.

A fuse, such as fuse 9AA shown in FIG. 1D, is a normally closed (i.e., conductive) switch element. To open (i.e., make nonconductive) the switch element electrical energy, heat energy or light energy (such as a laser beam or infrared beam) is applied to the switch element to disintegrate the electrically conductive member. In the embodiment shown in FIG. 1D, each of fuses 9AA–9EE is an electric fuse that includes a central narrower separable portion that disintegrates on passage of a current of a selected magnitude for a selected duration. In accordance with this invention, a fuse can be formed of a variety of geometric shapes and from a variety of materials as discussed in the application Ser. No. 08/194,110.

To program the circuitry of FIG. 1D, selected fuses are opened (blown or programmed) by using electrical energy (voltage/current). For example, in FIG. 1D, the fuse labeled 9BD is opened by application of a programming current source between via holes labeled 4B and 3D. On selectively opening fuses 9AA–9EE, the initial connections between via holes 3A–3E and 4A–4E are opened. Therefore any terminal of an electronic component in via holes 3A–3E can be left connected to any other terminal or terminals in via holes 4A–4E to achieve any desired interconnection pattern.

In one embodiment in accordance with this invention, a fuse for a PCB is 3 mils long, 3 mils wide, 300 microinches thick and formed of solder with an optional thin copper interfacial layer. The optional interfacial layer provides adhesion between the solder and the PCB substrate and is an integral part of the fuse. Such a PCB fuse has a resistance in the range of 1 to 1000 milli-ohm and is programmed by applying a current of 1 to 2 amperes for 10 to 1000 microseconds. To ensure an open circuit, the programming current can be applied for a longer duration (1 millisecond) depending on the fuse characteristics.

As described in these two applications, multi-layered structure 111M can be formed by conventional processes used to form, for example, a printed circuit board (PCB), a printed wiring board (PWB) a multi-chip module (MCM) or a package for an integrated circuit. In addition, multi-layered structure 111M can also be formed using processes and materials for forming "burn-in board" as described in U.S. patent application Ser. No. 08/320,145 or U.S. patent application Ser. No. 08/194,110.

In accordance with this invention, a fuse (such as, for example one of fuses 9AA–9EE (FIG. 1D) can be formed of any electrically conducting material. Forming fuses from materials widely used in the PCB environment such as for example, copper, solder (Sn—Pb) and nickel has the important advantage of fuse manufacture being compatible with standard PCB processing. Therefore, in accordance with this invention, a fuse can be formed using common PCB processes such, as for example, electrolyte plating, electrodeless plating, physical or chemical vapor deposition and sputtering methods depending on the constraints and needs of a particular application. For example, electrolytic plating results in better quality of fuse material but results in loss of control on layer thickness and uniformity in geometry. On the other hand, although electrodeless plating provides better control on layer thickness, adhesion of the fuse layers is a problem. Finally, physical or chemical vapor deposition provide better control of both thickness and geometry but has the drawback of being too expensive.

In one embodiment, fuse blowing characteristics are optimized without increasing resistance (1 to 1000 milli-ohm)

by using fuse materials different from PCB materials. Such fuse materials include materials with melting points lower than 1000° C. Such low melting point fuse materials include, for example, tin, lead, thallium, zinc, antimony, magnesium and aluminum. Furthermore, alloys or combinations of such low melting point materials can also be used as fuse materials in accordance with this invention. Finally, in forming a fuse, optionally an interfacial layer can be used to improve adhesion of the fuse material to the PCB materials. For example, copper and/or nickel can be used to improve adhesion of solder or a low melting point fuse material to the PCB substrate.

Several advantages flow from the use of fuses described above. One advantage is that fuse geometry can be used to minimize the real estate and maximize the programming efficiency while providing adequate current carrying capacity. Programming efficiency is improved by reducing the programming time and/or programming current. Moreover, the above described fuses permit the use of an electrical programmer so that a wire need not be manually added to make an electrical connection between the terminals of various electronic components. Also, the use of electrical programming permits the placement of a fuse on an inner layer of a PCB so that the uppermost surface is available for mounting electronic components or for forming custom traces.

Multi-layered structure 111M has a programming access edge 111E1 and a signal interface edge 111E2. In this embodiment, programming access edge 111E1 and signal interface edge 111E2 are two opposite edges of multi-layered structure 111M.

A number of programming electrical contacts, such as electrical contacts 111A1 to 111A80, are formed a programming access edge 111E1. Also, a number of first signal electrical contacts, such as electrical contacts 111B1 to 111B40, and a number of second signal electrical contacts, such as electrical contacts 111C1 to 111C40, are formed at signal interface edge 111E2.

Matrix 111S of fuses and/or antifuses in scrambler card 111 can be programmed through electrical contacts 111A1 to 111A80 to couple any one of first signal electrical contacts 111B1 to 111B40 to any one of second signal electrical contacts 111C1 to 111C40, for example, using the programming methods and apparatus described in U.S. patent application Ser. No. 08/320,145. After scrambler card 111 has been appropriately programmed, signal interface edge 111E2 can be inserted into an edge connector 112 on burn-in board 110 (FIG. 1B) to provide a junction between signal drivers and receivers (not shown) and traces (not shown) on burn-in board 110, in the conventional manner.

FIG. 1C illustrate a perspective view of scrambler card 111 mounted in edge connector 112 of burn-in board 110 at an angle θ, such that 0≦θ≦90°, and can be, for example 30° depending on the space available between two adjacent burn-in boards in a burn-in oven. For clarity, only two devices-under-test 141 and 144 and only a few vertically mounted associated resistors 121C and 124C are illustrated in FIG. 1C.

In one embodiment, first signal electrical contacts 111B1 to 111B40 are coupled to signal drivers and receivers while second signal electrical contacts 111B2 are coupled to terminals of one or more device-under-test (not shown) mounted in component sockets, such as component sockets 121 to 132 on board 110. Each terminal of a device-under-test is connected through a resistor, such as resistor 121-1 (insert 141I) located adjacent to socket 121, to one of second signal electrical contacts 111C1 to 111C40. Burn-in board 110 with scrambler card 111 can be used in a conventional burn-in oven in a conventional manner for burn-in testing of electronic components.

Matrix 111S of fuses and/or antifuses built into scrambler card 111 allows a scrambler card to be quickly programmed using an electrical programmer, for performing any type of burn-in testing selected by a user. Also scrambler card 111 can be manufactured by conventional processes with fewer mistakes, lower labor costs and less programming time, as compared to a manually wired scrambler card.

Figure 2A:
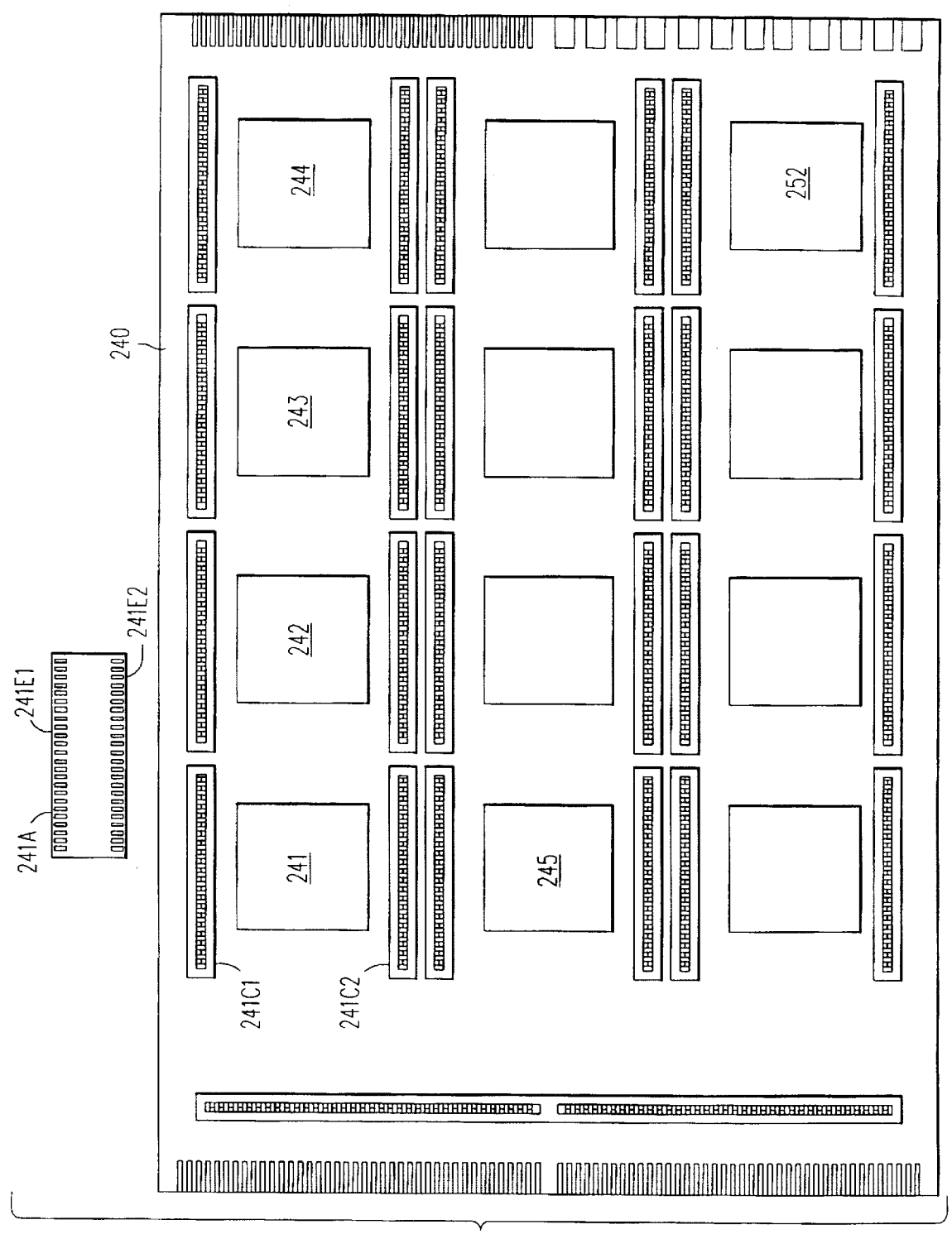
FIGS. 2A and 2B illustrate in plan view one embodiment of a programmable device-under-test (DUT) card for a burn-in board.

A multi-layered structure with a matrix of fuses and/or antifuses can also be used to form an electrically programmable device-under-test card such as DUT card 241A (FIG. 2A). DUT card 241A, has a programming access edge, such as programming access edge 241E1 and a signal interface edge, such as signal interface edge 241E2. Signal interface edge 241E2 can be inserted into an edge connector, such as edge connector 241C1 provided adjacent to a component socket, such as socket 241 to provide a junction between the terminals of a device-under-test (not shown) and various traces (not shown) in burn-in board 240 that are couplable to signal drivers and/or receivers. Any number of DUT cards, such as one, two, three or four or more, as appropriate, can be provided in a burn-in board depending on for example the number of terminals of a device-under-test.

Figure 2B:
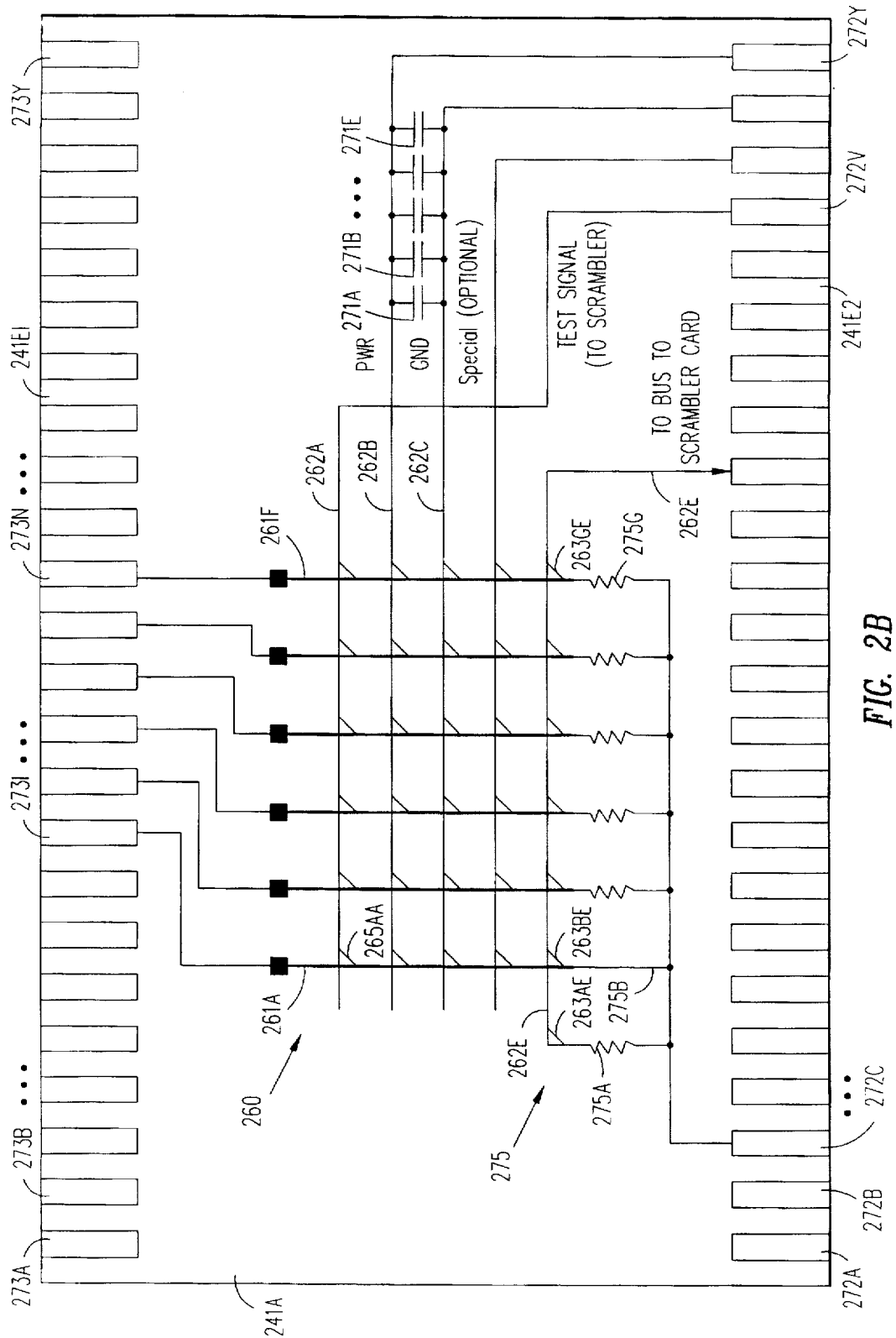

FIG. 2B illustrates a DUT card 241A in accordance with this invention. DUT card 241A includes a number of electrical contacts, such as electrical contacts 272A to 272Y formed on signal interface edge 241E2. Several electrical contacts, such as electrical contacts 272A to 272C on signal interface edge 241E2 are couplable by traces (not shown) in burn-in board 240 to a terminal of a DUT (not shown). Such electrical contacts, for example electrical contacts 272A to 272C, are connected in DUT card 241A by a resistor ladder 275 to an electrically programmable matrix 260.

Resistor ladder 275 includes a number of resistors, such as resistors 275A to 275G. Each of resistors 275A to 275G in resistor ladder 275 is connected to one of the traces such as 262A to 262E in matrix 260 through a fuse. For example, resistor 275A is connected to row trace 262E by fuse 263AE.

Each of the column traces 261A to 261F, such as trace 261A of matrix 260, is connected to each of the row traces, such as row traces 262A to 262E, by a number of fuses, such as fuses 263AA to 263AE. Each of the row traces, such as row trace 262A is connected to one of the electrical contacts on signal interface edge 241E2, such as electrical contact 272V.

In the embodiment of FIG. 2B, row trace 262A is couplable to a source of a predetermined test signal. Other row traces, such as row traces 262B and 262C are couplable to power terminal PWR and ground terminal GND. Each of the column traces, such as column traces 261A to 261F, is connected to one of electrical contacts 273A to 273Y on programming access edge 241E1. Column traces 261A to 261F are shown as connected to electrical contacts 273I to 273N respectively. In this embodiment, resistor ladder 275 can be formed of resistors having, for example, 10 K ohms, short, 5K ohms, 2–5 Kohms, 1 Kohms, 500 ohms and 250 ohms as the ratings for resistors 275A to 275B respectively.

By appropriately programming the fuses in fuse matrix 260, a terminal of a device-under-test couplable to one of the electrical contacts 272A to 272Y on signal interface edge 241E2 can be connected through a resistor of resistor ladder 275 to traces couplable to power and ground terminals and to drivers or receivers of signals such as predetermined test signals or one of other signals, such as a clock signal. In this embodiment, a number of capacitors, such as capacitors 271A to 271E are connected between trace 262B and trace 262C for decoupling power and ground voltages in the conventional manner to reduce noise spikes in the power supplied to a device-under-test (not shown) mounted in one of component sockets 241 to 252 of burn-in board 240 (FIG. 2A).

A DUT card can provide better power and ground to the terminals of a device-under-test because decoupling is performed adjacent to the device-under-test. The DUT card can be electrically programmed and therefore provides a low cost, short turn-around time, and error-free alternative to a conventional customized DUT card. Moreover, by appropriately programming DUT cards, the same burn-in board can be used for burn-in of a number of different integrated circuits that have the same package type.

In another embodiment, a DUT card has an architecture similar to DUT card 241A (FIG. 2B) except that resistances 275A, 275D, 275E, 275F and 275G, associated traces 261A, 261D, 261E, 261F and 261G and fuses connected to these associated traces are not present, resistances 275C is a discrete resistor.

In one embodiment of this invention, a number of first signal electrical contacts such as electrical contacts 272A, 272B, and 272C are each associated with a resistor ladder coupled to a fuse matrix, such as resistor 275 and fuse matrix 260 for electrical contact 272C. Each of the fuse matrices in DUT card 241A is associated with a set of programming electrical contacts connected to the column traces in the fuse matrix. For example, programming electrical contacts 273I ..., 273N are associated with fuse matrix 260 for electrical contact 272C. A number second signal electrical contacts, such as electrical contacts 272V and 272Y at signal interface edge 241E2 are connected to row traces in each fuse matrix, such as row traces 262A and 262B of fuse matrix 260.

In one embodiment of DUT card 241A, fuse matrix 260 can be used to couple for example signal electrical contact 272C to signal electrical contact 272V through a resistor 275A by preserving fuses 263AE, 263BE and 263AA and blowing all of the other fuses in fuse matrix 260. Programming of fuse matrix 260 can be performed through programming electrical contacts 273I ... 273N and signal electrical contacts 272I and 272V to 272Y.

In another embodiment of this invention, signal electrical contact 272C can be coupled to signal electrical contact 272V through resistors 275C and 275D by preserving fuses 263BA and 263CA and blowing all of the other fuses in fuse matrix 260.

The description of certain embodiments of this invention is intended to be illustrative and not limiting. Numerous other embodiments will be apparent to those skilled in the art in view of this disclosure and all such embodiments are included within the broad scope of this invention. For example, electrical contacts 273A to 273Y (FIG. 2b) can be formed as a bed of nails. Therefore, the scope of this invention should be determined only by the appended claims and their full scope of equivalents.

What is claimed is:

1. A device-under-test card for a burn-in board, said device-under-test card having a signal interface edge, a first plurality of electrical contacts formed at the signal interface edge and a programming access edge opposite the signal interface edge, a second plurality of electrical contacts formed at the programming access edge, the device-under-test card comprising:

a matrix of fuses including a plurality of electric fuses, a plurality of row traces and a plurality of column traces, a first column trace being connected to a first electrical contact in the first plurality;

a ladder of resistors, each resistor being connected to a column trace and to a common second electrical contact in the second plurality, wherein a first fuse couples a first row trace to a first column trace and a second fuse couples a second row trace to the first column trace; and a capacitor coupled between the first row trace and the second row trace, the first row trace being connected to a third electrical contact in the second plurality and the second row trace being connected to a fourth electrical contact in the second plurality.

2. The device-under-test card of claim 1 wherein each row trace and each column trace includes a first electrically conducting material, and each electric fuse has a separable portion including a second electrically conducting material sufficiently different from the first electrically conducting material such that each electric fuse's separable portion disintegrates on passage of a programming current of a predetermined magnitude for a predetermined duration through the separable portion.

* * * * *